(12) United States Patent
Zhang et al.

(10) Patent No.: US 8,686,285 B2
(45) Date of Patent: Apr. 1, 2014

(54) EUTECTIC MELTS

(75) Inventors: Jing Zhang, Changchun (CN);
Chengcheng Xi, Changchun (CN);
Yiming Cao, Changchun (CN); Feifei Gao, Changchun (CN); Peng Wang, Changchun (CN); Shaik Mohammad Zakeeruddin, Renens (CH); Michael Graetzel, St-Sulpice (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 291 days.

(21) Appl. No.: 12/735,281

(22) PCT Filed: Dec. 23, 2008

(86) PCT No.: PCT/IB2008/055507
§ 371 (c)(1),
(2), (4) Date: Sep. 28, 2010

(87) PCT Pub. No.: WO2009/083901
PCT Pub. Date: Jul. 9, 2009

(65) Prior Publication Data
US 2011/0012048 A1    Jan. 20, 2011

(30) Foreign Application Priority Data
Dec. 29, 2007  (CN) .......................... 2007 1 0306662

(51) Int. Cl.
*H01G 9/20* (2006.01)

(52) U.S. Cl.
USPC .......................................................... 136/263

(58) Field of Classification Search
USPC .................. 252/62.2, 500; 359/270; 429/324; 136/263
See application file for complete search history.

(56) References Cited

U.S. PATENT DOCUMENTS

| | | | |
|---|---|---|---|
| 5,135,825 A * | 8/1992 | Mori et al. ................... | 548/101 |
| 6,291,763 B1 | 9/2001 | Nakamura | |
| 2002/0015881 A1 | 2/2002 | Nakamura et al. | |
| 2005/0175867 A1* | 8/2005 | Adachi et al. .................. | 429/12 |

FOREIGN PATENT DOCUMENTS

| | | | |
|---|---|---|---|
| EP | 1819005 | * | 8/2007 |
| EP | 1819005 A1 | | 8/2007 |

OTHER PUBLICATIONS

Bai et al, "High-performance dye-sensitized solar cells based on solvent-free electrolytes produced from eutectic melts", Nature Materials, 7, Jun. 29, 2008, pp. 626-630.*

Wasserscheid P., Ionic Liquids in Synthesis, 2002, Wiley, Weinheim (pp. 9-20,174-213).
Ohno H., Electrochemical Aspects of ionic liquids, 2005, Wiley, New Jersey. (pp. 173-186, 187-198, 199-203).
Rogers R. D., Seddon K. R., eds. Ionic Liquids as Green Solvents: Progress and Prospects. ACS Symposium Series 856, Washington, DC: American Chemical Society, 2003 (pp. 264-277, 478-494).
Rogers R., Seddon K. R. eds. Ionic Liquids: Industrial Applications to Green Chemistry, ACS Symposium Series 818, Washington DC: American Chemical Society, 2002 (pp. 2-14, 321-333).
Welton T., Room-temperature molten liquids. Solvents for synthesis and catalysis, Chem. Rev. 99(8), 1999, 2071-83.
Dupont J. et al., Ionic liquid (molten salt) phase organometallic catalysis, Chem. Rev., 102 (10), 2002, 3667-3691.
Miao W. and Chan T.H., Ionic-liquid-supported synthesis: A novel liquid-phase strategy for organic synthesis, Acc. Chem. Res. 39(12), 2006, 897-908.
Seddon K. R., Ionic liquids for clean technology, J. Chem. Technol. Biotechnol., 68(4), 1997, 351-354.
Gordon C. M., New developments in catalysis using ionic liquids, Applied Catalysis A: General, 222, 2001, 101-117.
Zhao D. et al., Ionic liquids: applications in catalysis, Catalysis Today 74, 2002, 157-189.
Sheldon R., Catalytic reactions in ionic liquids, Chem. Comm., 23, 2001, 2399-2407.
Singh P. et al., Photoelectrochemical behavior of n-GaAs electrodes in ambient-temperature molten-salt electrolytes, J. Am. Chem. Soc., 102, 1980, 4676-4681.
Singh P. and Rajeshwar K., Mechanisms of charge transfer at the n-GaAs/room temperature molten salt electrolyte interface, J. Electrochem. Soc., 128, 1981, 1724-1731.
Rajeshwar K. et al., Effect of temperature on the operation of a photoelectrochemical device: studies on the n-GaAs/room temperature molten salt electrolyte interface, J. Electrochem. Soc., 128, 1981, 1750-1754.
Bonhôte P. et al., Hydrophobic, highly conductive ambient-temperature molten salts, Inorg. Chem, 35, 1996, 1168-1178.
Matsumoto H. et al., The application of room temperature molten salt with low viscosity to the electrolyte for dye-sensitized solar cell, Chem. Lett., 26, 2001, 26-27.
Wang P. et al., High efficiency dye-sensitized nanocrystalline solar cells based on ionic liquid polymer gel electrolyte, Chem. Commun, 2972, 2002, 2972-2973.
Wang et al., A New Ionic Liquid Electrolyte Enhances the Conversion Efficiency of Dye-Sensitized Solar Cells, J. Phys. Chem. B, 2003, 107, 13280-13285.

* cited by examiner

*Primary Examiner* — Carol M Koslow
(74) *Attorney, Agent, or Firm* — Krieg DeVault LLP; Clifford W. Browning

(57) ABSTRACT

The present invention refers to using the principal of a room temperature molten ionic liquid, to an electrolyte, to devices comprising the ionic liquid co-melting, and to the preparation of a room temperature ionic liquid via various physical and chemical methods. The room temperature molten ionic liquid comprises at least two component salts, at least one of which is not molten at room temperature, but, if combined with another salt, is in the molten state at room temperature.

11 Claims, 3 Drawing Sheets

…

EUTECTIC MELTS

Figure 1:
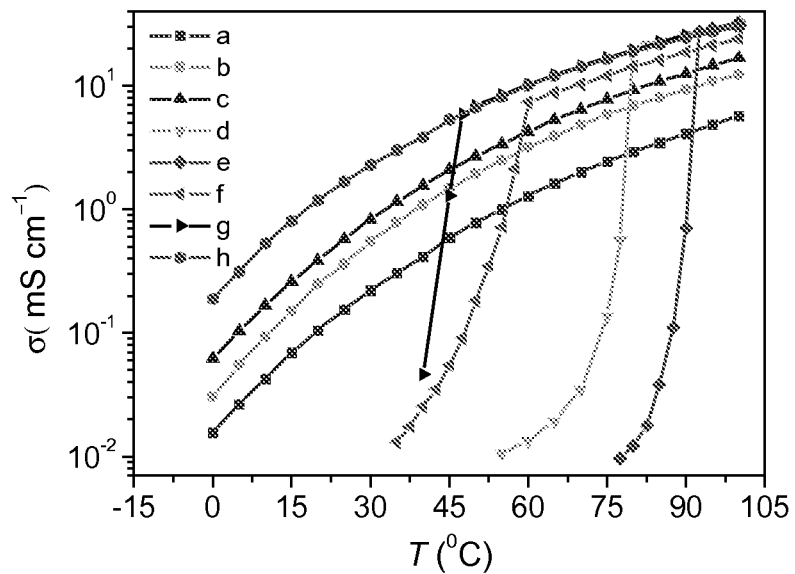

This application claims the benefits under 35 U.S.C. 119 (a)-(d) or (b); or 365(b) of International Application No. PCT/IB2008/055507 filed 23 Dec. 2008, and China Patent Application No. 200710306662.1, filed 29 Dec. 2007.

TECHNICAL FIELD

The present invention generally relates to the fields of ionic liquids, electrolytes, optoelectronic and electrochemical devices. More particularly, the present invention relates to a composed ionic liquid comprising at least two component salts. The invention also relates to a photoelectronic conversion device comprising the composed ionic liquid.

PRIOR ART AND THE PROBLEM UNDERLYING THE INVENTION

The term ionic liquids generally refers to salts having an organic component and that have a melting point below 100° C. In the state of the art, a lot of compounds are used as ionic liquids. For example, Hurley and Wier disclosed solvent-free ionic liquids in a series of US patents. (U.S. Pat. No. 2,446,331, U.S. Pat. No. 2,446,339, and U.S. Pat. No. 2,446,350). These "room temperature melting salts" are based on $AlCl_3$ and various salts of n-alkyl pyridinium halide. Recently, some reviews on this subject have been published which explained the synthetic, property of pyridinium type, imidazolium type, quaternary ammonium salt type, as well as its use in the field of catalysis, synthesis, lithium battery, fuel cell and solar cell, etc. Some of these reviews are cited: Welton T., Room-temperature molten liquids. Solvents for synthesis and catalysis, Chem. Rev. 99(8), 1999, 2071-83; Dupont J. et al. Ionic Liquid (molten salt) phase organometallic catalysis, Chem. Rev., 102 (10), 2002, 3667-3691; Miaou W. S. et al. Ionic-liquid-supported synthesis: A novel liquid-phase strategy for organic synthesis, Acc. Chem. Res. 39(12), 2006, 897-908; Seddon K. R., Ionic liquids for clean technology, J Chem Technol Biotechnol, 68(4), 1997, 351-354; Gordon C. M., New developments in catalysis using ionic liquids, Applied Catalysis A: General, 222, 2001, 101-117; Zhao D. et al., Ionic liquids: applications in catalysis, Catalysis Today 74, 2002, 157-189; Sheldon R., Catalytic reactions in ionic liquids, Chem. Comm., 23, 2001, 2399-2407; Peter Wassersc-heid, Ionic Liquids in Synthesis, 2002, Wiley, Weinheim; Ohno H., Electrochemical Aspects of ionic liquids, 2005, Wiley, New Jersey; Rogers R. D., Seddon K. R., eds. Ionic Liquids as Green Solvents: Progress and Prospects. ACS Symposium Series 856, Washington, D.C.: American Chemical Society, 2003; Rogers R., Seddon K. R. eds. Ionic Liquids: Industrial Applications to Green Chemistry. ACS Symposium Series 818. Washington D.C.: American Chemical Society, 2002.

Ionic liquids have drawn much attention due to their properties of high conductivity, extremely low vapor pressure, thermal stability and difficulty to burn, amongst others. In the early 1980's, Rajeshwar et al. used the Ionic liquid such as $PyCl/AlCl_3$ as electrolyte, and n-GaAs or n-InP as photoanode, to produce a photoelectrochemical cell with the efficiency of 1.7% (P. Singh, K. Rajeshwar, J. DuBow, R. Job, J. Am. Chem. Soc., 102, 1980, 4676; P. Singh, R. Singh, K. Rajeshwar, J. DuBow, J. Electrochem. Soc., 128, 1981, 1724; K. Rajeshwar, P. Singh, R. Thapar, J. Electrochem. Soc., 128, 1981, 1750).

In 1996, M. Grätzel et al. used a mixture of 1-hexyl-3-methylimidazolium iodide (HMII) (high viscosity) and 1-ethyl-3-methylimidazolium triflate (EMItriflate) (low viscosity) in the ratio of 1:9 as an electrolyte of a dye-sensitized solar cell and the resultant power conversion efficiency was below 0.5% (N. Papageorgiou, Y. Athanassov, M. Armand, P. Bonhôte, H. Pettersson, A. Azam, M. Grätzel, Inorg. Chem., 35, 1996, 1168). In 2001, Matsumoto et al. used a mixture of the ionic liquid $EMIF(HF)_{2.3}$ (ultra-low viscosity) and DMHII as the electrolyte of a dye-sensitized solar cell and the resultant power conversion efficiency was 2.1% (H. Matsumoto, T. Matsuda, T. Tsuda, R. Hagiwara, Y. Ito, Y. Miyazaki, Chem. Lett., 26, 2001).

In 2002, M. Grätzel et al. used 1-propyl-3-methylimidazolium iodide (PMII) as the electrolyte of a dye-sensitized solar cell, and the resultant efficiency was 5.3% (P. Wang, S. M. Zakeeruddin, I. Exnar, M. Grätzel, Chem. Commun, 2972). These results meant a breakthrough in the use of ionic liquids in dye-sensitized solar cells.

It is a general objective of the present invention to provide new ionic liquids having improved properties, such as conductivity, fluidity, melting points and/or others characteristics, which contribute to the improvement of the systems, devices and/or processes in which these ionic liquids are used.

For example, it is an objective to provide a ionic liquid having a low melting point, preferably around or below room temperature (25° C.), and/or which has a higher conductivity in the liquid (molten) state.

In particular, it is an objective to produce ionic liquids useful as electrolytes, solvents, lubricants, and catalysts.

With respect to optoelectronic and/or electrochemical devices, it is an objective of the present invention to provide ionic liquids that can be used in such devices and which improve the device characteristics.

For example, with respect to photoelectric conversion devices, it is an objective to provide a ionic liquid that can be used in such a device and that results in improved short-circuit photocurrent density ($J_{oc}$), open-circuit voltage ($V_{oc}$), fill factor (FF) and/or photoelectric conversion ($\eta$), and/or that contributes to the long-term stability of such devices.

Further objectives of the present invention are to provide room temperature molten ionic liquids having high conductivity, to provide ionic liquids based on imidazolium derivatives, and/or to provide convenient methods for preparing ionic liquids.

SUMMARY OF INVENTION

The present inventors provide composed ionic liquids comprising two or more component salts. Remarkably, the composed ionic liquids have improved properties. In particular, on the basis of these composed ionic liquids, optoelectronic and/or electrochemical devices with improved characteristics are obtained.

The present invention provides, in a first aspect, a composed ionic liquid. The ionic liquid may be a binary, ternary, quaternary, etc. ionic liquid, comprising two, three, four or more component salts. Preferably, the component salts are ionic liquids.

Accordingly, in an aspect, the present invention provides a composed ionic liquid comprising two or more component salts, wherein the melting point of at least one of said ionic liquids is above the melting point of the composed ionic liquid.

In another aspect, the present invention provides a composed ionic liquid comprising two or more component salts, wherein the melting point of the composed ionic liquid is below the melting point of at least two of said component salts.

In an aspect, the present invention provides a composed ionic liquid comprising composed ionic liquid comprising two or more component salts, wherein the melting point of at least one of said component salts is above room temperature (25° C.).

In an aspect, the present invention provides a composed ionic liquid comprising two or more component salts, wherein the melting point of the composed ionic liquid is at or below room temperature.

According to yet other aspects, the present invention relates to an electrolyte comprising and/or based on or consisting of said composed ionic liquid, to an electrochemical and/or optoelectric device comprising the composed ionic liquid, and to a photoelectric conversion device comprising the composed ionic liquid.

Further aspects and preferred embodiments of the present invention are provided in the appended claims.

The present invention provides many advantages. First, all the compounds of the present invention have salt-like properties, and can very easily dissolved in organic solvents.

Compared to the known ionic liquids, the inventive composed ionic liquid has a surprisingly low melting point. Furthermore, the composed ionic liquid has a good stability. It can be stored at room temperature.

The inventive ionic liquid can be readily prepared with high yield (normally above 80%, preferably above 90%), and raw materials for its preparation are readily available.

The inventive ionic liquid can be used as the solvent of various synthetic or catalyzing reactions. For example, the ionic liquid can be used as a non-aqueous, polarising species, as a phase transfer catalyst and/or as a medium making a homogenous heterogeneous catalysis.

Past research shows that the tendency to use anions and small size cations with a high concentration of electro-active iodine as the electrolyte system of dye sensitised solar cells.

In general, the smaller the size of the component ions, the higher is the melting point of the salt/ionic liquid. When the melting point is above room temperature, the ionic liquid cannot be used widely even if it has many superior properties in various aspects. The inventive imidazolium type composed ionic liquid is based on ions of small size, and thus results in a breakthrough of non-volatility and low viscosity ionic liquid electrolytes. Photoelectric conversion devices, in particular dye-sensitized solar cells using electrolytes based on the ionic liquids of the present invention achieve power conversion efficiencies of 7.1% and 8.20%, which the highest level so far achieved with ionic liquid-based dye-sensitized solar cells.

In the drawings,

FIG. 1 shows the conductivity of a series imidazolium type ionic liquids as a function of temperature (0-100° C.). The meaning of the letters in the figure are as follows:

a: 1-hexyl-3-methylimidazolium iodide (HMII); b: 1-butyl-3-methylimidazolium iodide (BMII); c: 1-propyl-3-methylimidazolium iodide (PMII); d: 1-ethyl-3-methylimidazolium iodide (EMII); e: 1,3-dimethylimidazolium iodide (DMII); f: 1-allyl-3-methylimidazolium iodide (AMII);

g: a composed ionic liquid according to the invention based on EMII and DMII at a molar ratio of 1:1;

h: a composed ionic liquid according to the invention based on EMII, DMII and AMII at a molar ratio of 1:1:1.

Figure 2:
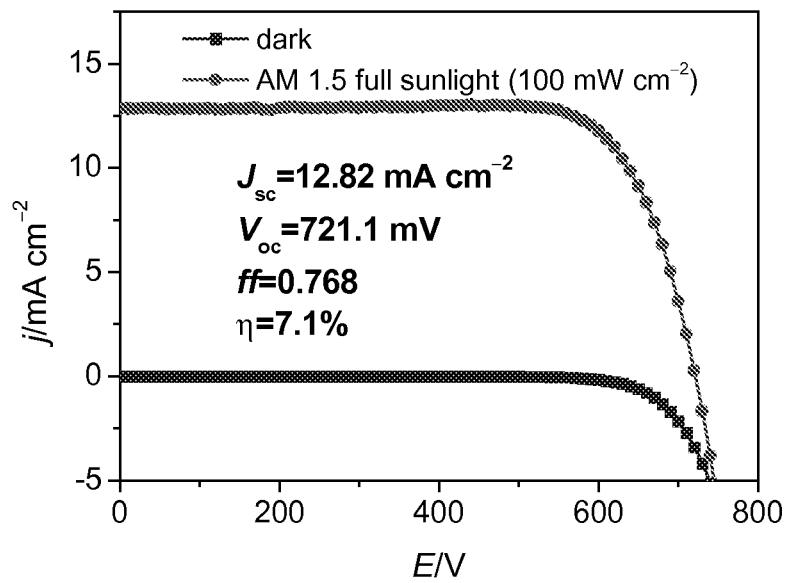

FIG. 2 is the J-V coordinate graph of the dye-sensitized solar cell of Example 7, comprising a ternary ionic liquid in accordance with the present invention (DMII, EMII and AMII). The results are indicated in the graph. A power conversion efficiency of 7.1% is obtained.

Figure 3:
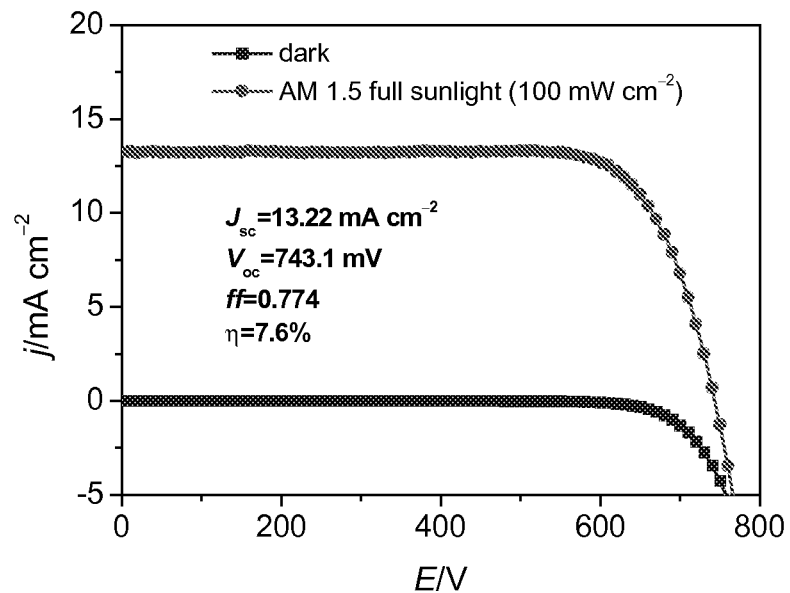

FIG. 3 is the J-V coordinate graph of the dye-sensitized solar cell of Example 8, comprising a ternary ionic liquid in accordance with the present invention (DMII, EMII, EMINCS). The results are indicated in the graph. A power conversion efficiency of 7.6% is obtained.

Figure 4:
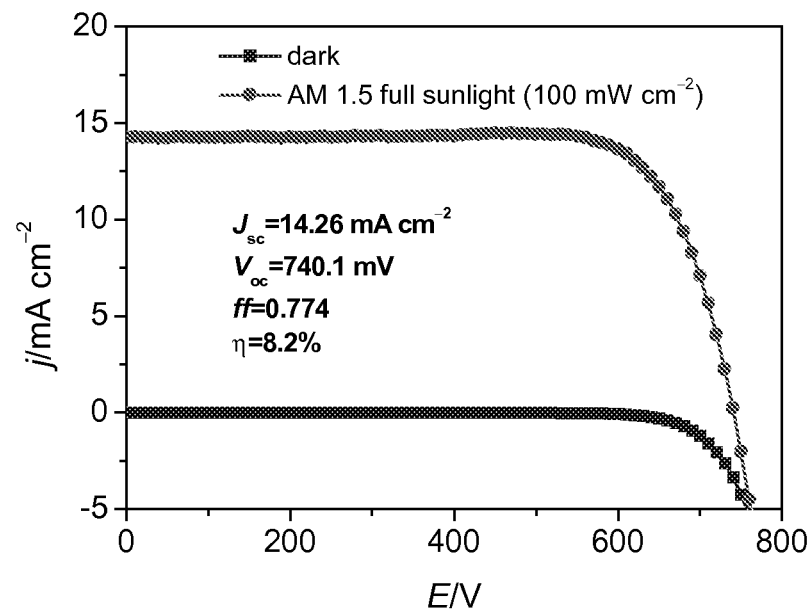

FIG. 4 is the J-V coordinate graph of the dye-sensitized solar cell of Example 9, comprising a ternary ionic liquid in accordance with the present invention (DMII, EMIII, EMITCB). The results are indicated in the graph. A power conversion efficiency of 8.2% is obtained.

Figure 5:
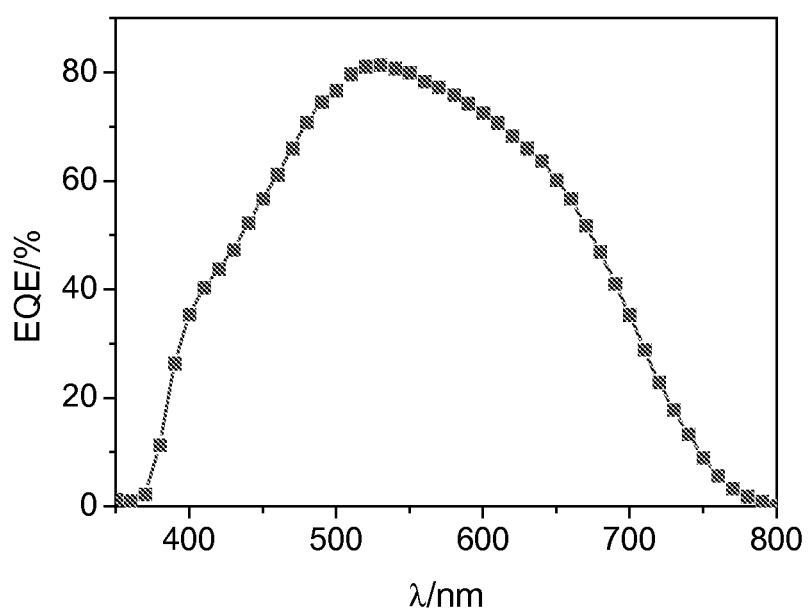

FIG. 5 shows the photocurrent action spectrum of the dye-sensitized solar cells of Example 9.

DETAILED DESCRIPTION OF THE PREFERRED EMBODIMENTS

The composed ionic liquid of the invention comprises two or more component salts. For the purpose of the present specification, the terms "comprising" and "comprise" mean "Including, amongst others". These terms are not intended to mean "consist only of".

According to a preferred embodiment, at least one of the component salts of the composed ionic liquid is a ionic liquid itself. According to the generally used definition of the term, an "ionic liquid" is a salt that is liquid at 100° C.

A material is considered liquid, if it has any measurable liquid properties, in particular, if it has the property of a fluid (as opposed to a solid body) and any measurable viscosity. According to a preferred embodiment, a material is considered as liquid, if it has a viscosity of 20,000 cPs (centipoises) or less, preferably 15,000 cPs or less, more preferably 10,000 cPs or less. The terms "molten", "co-melted" also refer to "liquid" as defined herein. The term liquid does not refer to the gaseous state.

According to a preferred embodiment, the melting point of at least one of said component salts of the ionic liquid of the present invention is above room temperature. The term "room temperature" refers to the temperature of 25° C.

According to a preferred embodiment, the composed ionic liquid of the present invention is itself liquid at room temperature.

According to a preferred embodiment, one, two, three, four, a part of or all of the component salts that are comprised in the composed ionic liquid are ionic liquids.

According to a preferred embodiment, the present invention concerns a room temperature molten composed ionic liquid, characterized in that (1) the room temperature molten ionic liquid comprises at least two component salts, which may have the same cations or the same anions; and (2) the melting point of the room temperature molten ionic liquid is at or below room temperature, and the melting point of at least one of the at least two component salts is above the room temperature.

According to an embodiment, two or more of said component salts of said composed ionic liquid comprise the same anion or the same cation.

According to an embodiment, one, two or more of the component salts of the composed ionic liquid of the invention comprises a cation, which is independently selected from organic compounds comprising at least one charged atom selected from the group of $N^+$, $P^+$, $C^+$, $S^+$, and combinations thereof, wherein said organic compound is a hydrocarbon optionally being substituted and optionally comprising, one or several heteroatoms, or, if said charged atom is a heteroatom, one or several further heteroatoms. Preferred heteroatoms include O, N, S, P, and halogen, such as F, Cl, Br, I. Preferably, the organic compound is a hydrocarbon comprising a positively charged nitrogen atom (N$^+$) and optionally comprising one or more further hetero atoms, in other words, the cation comprises at least one heteroatom, in case that the charged atom (N$^+$, P$^+$, C$^+$, S$^+$) is a heteroatoms, or 0, one or more heteroatoms, in case that said charged atom is not a heteroatom (C$^+$).

According to an embodiment, one, two, three, four or more of the cations of the composed ionic liquid are selected from hydrocarbons comprising from 1-100 carbons and from 0-20, preferably 1-10 heteroatoms. According to a still preferred embodiment, one, two, three, four or more of the of the cations of the composed ionic liquid are selected from hydrocarbons comprising from 1-25 carbons and from 0-10, preferably 1-5 heteroatoms. Most preferably, 1, 2, 3, or more of said cations are selected from hydrocarbons comprising from 1-10 carbons and from 1-5 heteroatoms. The advantages of having component ions of small size were mentioned above.

According to an embodiment, the cations of the component salts are independently selected from:

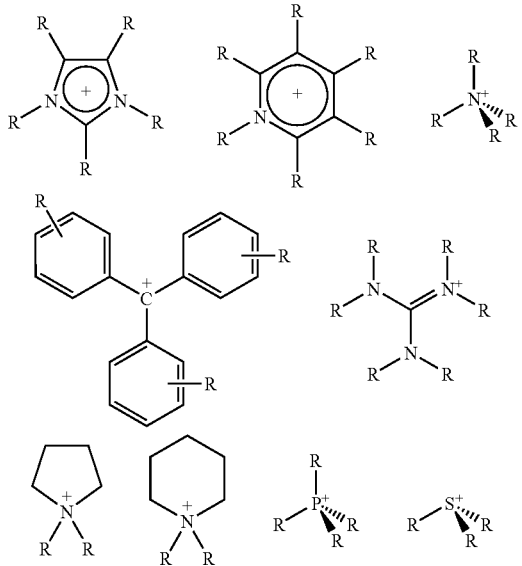

wherein
1) any R is independently selected from:
H, provided that at least one R connected to a heteroatom is not H;
a straight alkyl or branched alkyl containing 1-20 carbon atoms; or,
straight alkenyl or branched alkenyl containing 2-20 carbon atoms and one or more double bonds;
a straight alkynyl or branched alkynyl containing 2-20 carbon atoms and one or more triple bonds;
a saturated, partial saturated or completely unsaturated cyclic alkyl containing 3-7 carbon atom; or,
halogen, particularly F or Cl, provided that the respective R is not connected to a hetero atom;
—NO$_2$, provided that the respective R is not connected to a heteroatom with positive charge and at least one R is not NO$_2$;
—CN, provided that the respective R in not connected to a heteroatom with positive charge and at least one R is not CN.
(2) the moieties R of the cation of said components are same or different from each other;

two or more R may be coupled with each other via one or more single and/or double bonds;

one or more R are hydrogen-substituted partially or completely by halogen, particularly by —F or —Cl, or partially substituted by —CN or —NO$_2$, provided that at least one R is not halogenated;

one or two carbon atoms of R are replaced by the hetero atoms, or selected from: —O—, C(O)—, C(O)O—, —S—, —S(O)—, —SO$_2$—, —S(O)$_2$O—, —N=, —P=, —NR'—, —PR'—, —P(O)(OR')—, —P(O)(OR')O—, —P(O)(NR'R')—, —P(O)(NR'R')O—, —P(O)(NR'R')NR'—, —S(O)NR'— or —S(O)$_2$NR'—;

wherein
R' is H, unfluorinated, partially fluorinated, or completely fluorinated alkyl containing 1-6 carbon atoms, or unfluorinated, partially fluorinated, or completely fluorinated phenyl.

Two or more R of said organic cations may be coupled with each other to form a ring fused to the structure of organic cations given above. In this way, a cyclic compound, a bicyclo compound and/or a polycyclo compound may be obtained, for example.

In case that an R is completely halogenated, at least one R is not completely halogenated. In other words, not all R are completely halogenated.

Preferred substituents R of the organic cations of the composed ionic liquid may be independently selected from —F, —Cl, —Br, —I, —CH$_3$, —C$_2$H$_5$, —C$_3$H$_7$, —CH(CH$_3$)$_2$, —C$_4$H$_9$, —C(CH$_3$)$_3$, —C$_5$H$_{11}$, —C$_6$H$_{13}$, —C$_7$H$_{15}$, —C$_8$H$_{17}$, —C$_9$H$_{19}$, —C$_{10}$H$_{21}$, —C$_{12}$H$_{25}$, —C$_{20}$H$_{41}$, —OCH$_3$, —OCH(CH$_3$)$_2$, —CH$_2$OCH$_3$, —C$_2$H$_4$OCH(CH$_3$)$_2$, —SCH$_3$, —SCH(CH$_3$)$_2$, —C$_2$H$_4$SC$_2$H$_5$, —C$_2$H$_4$SCH(CH$_3$)$_2$, —S(O)CH$_3$, —SO$_2$CH$_3$, —SO$_2$C$_2$H$_5$, —SO$_2$C$_3$H$_7$, —SO$_2$CH(CH$_3$)$_2$, —CH$_2$SO$_2$CH$_3$, —OSO$_2$CH$_3$, —OSO$_2$CF$_3$, —CH$_2$NHC$_2$H$_5$, —N(CH$_3$)C$_3$H$_5$, —N(CH$_3$)CF$_3$, —O—C$_4$H$_8$—O—C$_4$H$_9$, —S—C$_2$H$_4$—N(C$_4$H$_9$)$_2$, —OCF$_3$, —S(O)CF$_3$, —SO$_2$CF$_3$, —CF$_3$, —C$_2$F$_5$, —C$_3$F$_7$, —C$_4$F$_9$, —C(CF$_3$)$_3$, —CF$_2$SO$_2$CF$_3$, —C$_2$F$_4$N(C$_2$F$_5$)C$_2$F$_5$, —CF=CF$_2$, —C(CF$_3$)=CFCF$_3$, —CF$_2$CF=CFCF$_3$, —CF=CFN(CF$_3$)CF$_3$, —CFH$_2$, —CHF$_2$, —CH$_2$CF$_3$, —C$_2$F$_2$H$_3$, —C$_3$FH$_6$, —CH$_2$C$_3$F$_7$, —C(CFH$_2$)$_3$, —CHO, —C(O)OH, —CHC(O)OH, —CH$_2$C(O)C$_2$H$_5$, —CH$_2$C(O)OCH$_3$, —CH$_2$C(O)OC$_2$H$_5$, —C(O)CH$_3$, —C(O)OCH$_3$,

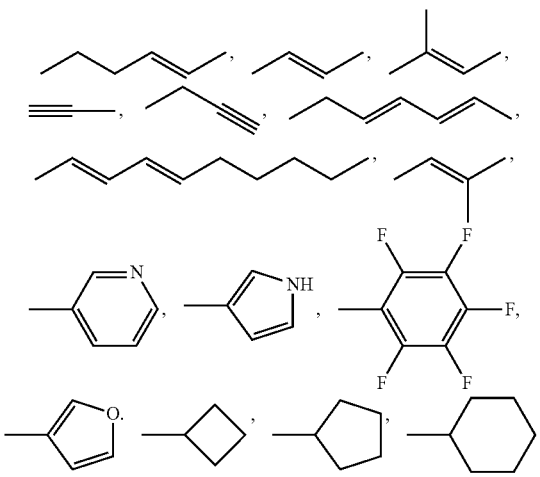

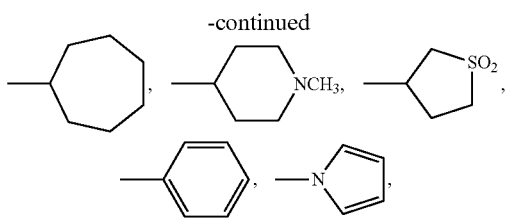

According to a preferred embodiment, the organic cations of the component salts of the present invention are selected from:

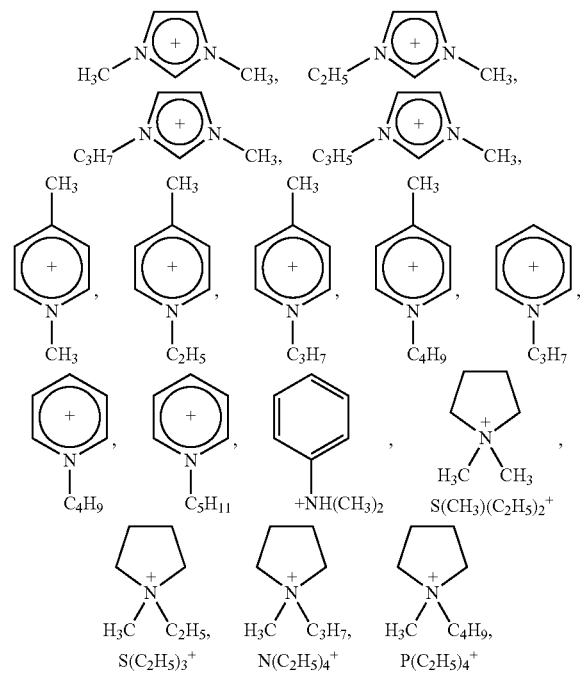

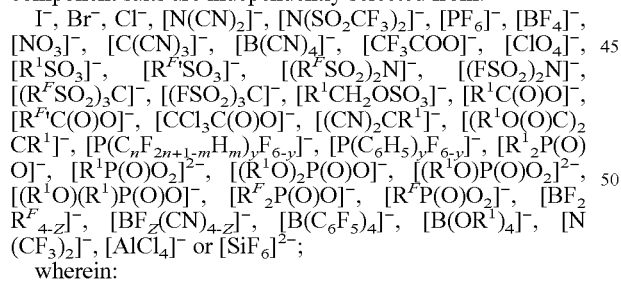

According to a preferred embodiment, the anions of the component salts are independently selected from:

I$^-$, Br$^-$, Cl$^-$, [N(CN)$_2$]$^-$, [N(SO$_2$CF$_3$)$_2$]$^-$, [PF$_6$]$^-$, [BF$_4$]$^-$, [NO$_3$]$^-$, [C(CN)$_3$]$^-$, [B(CN)$_4$]$^-$, [CF$_3$COO]$^-$, [ClO$_4$]$^-$, [R$^1$SO$_3$]$^-$, [R$^F$SO$_3$]$^-$, [(R$^F$SO$_2$)$_2$N]$^-$, [(FSO$_2$)$_2$N]$^-$, [(R$^F$SO$_2$)$_3$C]$^-$, [(FSO$_2$)$_3$C]$^-$, [R$^1$CH$_2$OSO$_3$]$^-$, [R$^1$C(O)O]$^-$, [R$^{F_1}$C(O)O]$^-$, [CCl$_3$C(O)O]$^-$, [(CN)$_2$CR$^1$]$^-$, [(R$^1$O(O)C)$_2$CR$^1$]$^-$, [P(C$_n$F$_{2n+1-m}$H$_m$)$_y$F$_{6-y}$]$^-$, [P(C$_6$H$_5$)$_y$F$_{6-y}$]$^-$, [R$^1$$_2$P(O)O]$^-$, [R$^1$P(O)O$_2$]$^{2-}$, [(R$^1$O)$_2$P(O)O]$^-$, [(R$^1$O)P(O)O$_2$]$^{2-}$, [(R$^1$O)(R$^1$)P(O)O]$^-$, [R$^F$$_2$P(O)O]$^-$, [R$^F$P(O)O$_2$]$^-$, [BF$_2$R$^F$$_{4-z}$]$^-$, [BF$_z$(CN)$_{4-z}$]$^-$, [B(C$_6$F$_5$)$_4$]$^-$, [B(OR$^1$)$_4$]$^-$, [N(CF$_3$)$_2$]$^-$, [AlCl$_4$]$^-$ or [SiF$_6$]$^{2-}$;

wherein:

n is an integer 1-20; m is 0, 1, 2, or 3; y is 0, 1, 2, 3 or 4; z is 0, 1, 2, or 3;

1) R$^F$ and R$^{F_1}$ are independently selected from:
completely fluorinated alkyl containing 1-20 carbon atoms, but R$^{F_1}$ does not include trifluoromethyl;
completely fluorinated alkenyl containing 2-20 carbon atoms and one or more double bonds; or,
completely fluorinated phenyl; or, saturated, partially unsaturated and or completely unsaturated cycloalkyl, said cycloalkyl can be replaced by perfluoroalkyl;

2) In the case that there are more than one R$^F$ or R$^{F_1}$ in an anion, they may be coupled with each other via one or more single bond or double bonds, forming cyclic, bicylcic or polycyclic structures;

3) One carbon atom or two non-adjacent carbon atoms of the substituents R$^F$ or R$^{F_1}$, which are not in the α-position to the hetero atom, may be replaced by the atoms and/or atom groups selected from —O—, —C(O)—, —S—, —S(O)—, —SO$_2$—, —N═, —N═N—, —NR'—, —PR'— and —P(O)R'—, or may have an end group R'—O—SO$_2$— or R'—O—C(O)—, wherein R' represents an unfluorinated, partially fluorinated or completely fluorinated alkyl containing 1-6 carbon atoms, saturated or partially saturated cyclic alkyl group containing 3-7 carbon atoms, unsubstituted or substituted phenyl or an unsubstituted or substituted heterocyclic;

4) Wherein two or more anions comprising an R$^F$ or an R$^{F_1}$ may be coupled to each other by a common R$^F$ or R$^{F_1}$ thereby forming a single molecule comprising the negative charges of both anions as indicated above;

5) Wherein substituent R$^F$ or R$^{F_1}$ may have one or two atoms or radicals or end groups selected from —SO$_2$X', —O—, —SO$_2$—, and —NR'; wherein said atom, radical or end group is not in the α position, and wherein two of these are not connected with each other, wherein R' is unfluorinated, partially fluorinated or completely fluorinated alkyl containing 1-6 carbon atoms, a cycloalkyl containing 3-7 carbon atoms, which is or is not further substituted, phenyl, which is or is not further substituted, or a heterocycle which is or is not further substituted; and, wherein X' is F, Cl, or Br.

According to a preferred embodiment, the substituents R$^F$ and/or R$^{F_1}$ of the anion(s) in the component salt of the composed ionic liquid of the present invention are selected from:
—CF$_3$, —C$_2$F$_5$, —C$_3$F$_7$, —C$_4$F$_9$, —C(CF$_3$)$_3$, —CF$_2$N(CF$_3$)CF$_3$, —CF$_2$OCF$_3$, —CF$_2$S(O)CF$_3$, —CF$_2$SO$_2$CF$_3$, —C$_2$F$_4$N(C$_2$F$_5$)C$_2$F$_5$, —CF═CF$_2$, —C(CF$_3$)═CFCF$_3$, —CF$_2$CF═CFCF$_3$, —CF═CFN(CF$_3$)CF$_3$, —CF$_2$SO$_2$F, —C(CF$_3$)═CFCF$_3$, —CF$_2$CF═CFCF$_3$, and/or —CF═CFN(CF$_3$)CF$_3$. Preferably R$^{F_1}$ is pentafluoroethyl (—CF$_2$CF$_3$), hepta-fluoropropyl (—CF$_2$CF$_2$CF$_3$), or nonylfluorobutyl (—CF$_2$CF$_2$CF$_2$CF$_3$).

6) Any substituent R$^1$ of said anion of the component salt is independently selected from:
H, provided that at least one R$^1$ connected to a heteroatom is not H;
an alkyl containing 1-20 carbon atoms;
an alkenyl containing 2-20 carbon atoms and one or more double bonds. Said alkenyl may be linear or branched. Examples of R$^1$ being alkenyl substituents are propenyl, 2 or 3-butenyl, isobutenyl, secondary butenyl, pentenyl, isopentene, hexenyl, heptenyl, —C$_9$H$_{17}$, —C$_{10}$H$_{19}$ to —C$_{20}$H$_{39}$. Preferably, R$^1$ is allyl, butenyl, isobutenyl or secondary butenyl.
an alkynyl containing 2-20 carbon atoms and one or more triple bonds. Preferred examples of such alkyneyls, which may be branched or linear, include acetenyl, propinyl, butylalkynyl, pentaalkynyl, hexaalkynyl, heptaalkynyl, —C$_9$H$_{15}$ or —C$_{10}$H$_{17}$ to —C$_{20}$H$_{37}$. Most preferred alkynyl substituents R$^1$ are acetenyl, 1 or 2-propinyl, 2 or 3 butylalkynyl, 4-pentaalkynyl, 3-pentaalkynyl and hexaalkynyl.
a saturated, partially saturated or completely unsaturated cyclic alkyl group containing 3-7 carbon atoms, which may be further substituted by an alkyl containing 1-6 carbon atoms. R$^1$ may be partially substituted by CN, SCN, SeCN, NO$_2$ and/or halogen, said halogen being F, Cl, Br, or I.

7) One carbon atom or two non-adjacent carbon atoms of any substituent R$^1$, which are not in an α-position to a hetero atom may be replaced by the atoms and/or atom groups selected from —O—, —C(O)—, —C(O)O—, —S—, —S(O)—, —SO$_2$—, —SO$_3$—, —N=, —N=N—, —NR'—, —PR'—, —P(O)R'—, —P(O)R'O—, PR'$_2$=N—, —C(O)NH—, —C(O)NR'—, —SO$_2$NH— or —SO$_2$NR'—, wherein R' represents unfluorinated, partially fluorinated, or completely fluorinated alkyl containing 1-6 carbon atoms; or a saturated or partially saturated cyclic group containing 3-7 carbon atoms an unsubstituted or substituted phenyl; or an unsubstituted or substituted heterocycle.

More preferably, the anions of the ionic liquid of the invention are selected from: I$^-$, Br$^-$, N(SO$_2$CF$_3$)$_2$$^-$, N(CN)$_2$$^-$, [BF$_4$]$^-$, [PF$_6$]$^-$, CF$_3$COO$^-$, [B(CN)$_4$]$^-$, [C(CN)$_3$]$^-$, or [BF$_3$CF$_3$]$^-$.

According to a preferred embodiment, at least one of said component salts of the composed ionic liquid of the invention comprises a cation of formula (I) below:

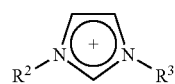

(I)

wherein R$^2$ and R$^3$ are independently of one another selected from C1-C10, preferably C1-C4 alkyl and C2-C10 alkenyl, wherein said alkyl and alkenyl may be linear, or, if it comprises at least three carbons, branched or cyclic, and may be partially or totally halogenated.

According to a preferred embodiment, said alkyl if the compound of formula (I) is a C1-C4, preferably C1-C3 alkyl and said alkenyl is a C2-C4, preferably a C2-C3 alkenyl.

According to a preferred embodiment, the composed ionic liquid of the invention comprises two different cations, which are selected, independently, from substituted imidazolium compounds as defined further above, and/or from compounds of formula (I).

According to a preferred embodiment, the composed ionic liquid of the invention comprises one or more cations selected from 1-ethyl-3-methylimidazolium (EMI), 1,3-dimethylimidazolium (DMI), 1-propyl-3-methylimidazolium (PMI), and 1-allyl-3-methylimidazolium (AMI).

According to a preferred embodiment, the composed ionic liquid of the invention comprises one or more anions selected from iodide (I$^-$), tetracyanoborate ([B(CN)$_4$]$^-$) and thiocyanate (NCS$^-$).

The present invention further provides methods for preparing the composed ionic liquids of the present invention.

In an aspect, the present invention provides a method for preparing a composed ionic liquid, the method comprising the step of introducing one or more component salts to a pure system containing one other component salt, ao that the entropy of the system is increased and the melting point is reduced. This is also referred to as "co-melting", which results from the increase of the entropy of the system.

There is a relationship for the transforming process:

$$\Delta G = \Delta H - T\Delta S$$

Herein, $\Delta G$ represents the change of the Gibbs free energy, $\Delta H$ is the change of the enthalpy, $\Delta S$ is the change of the entropy, T is Kelvin degree. For a melting process, $\Delta G=0$, so $\Delta H = T_{fus}\Delta S$, $T_{fus}$ is the melting point. Without wishing to be bound by theory, it is believed that even several types of ionic liquids are mixed, the entropy increases considerably, which results in the increase of $\Delta S$. For the system, although $\Delta H>0$, the change of the enthalpy is less than that of the entropy. Since $T_{fus}=\Delta H/\Delta S$, the melting point is reduced.

According to other aspects, the ionic liquids may be obtained by mixing component salts and heating.

According to the method of solvent vaporization (or evaporation), at least one component salt is dissolved in a solvent. Preferably, all component salts can easily be dissolved in the solvent. Preferably, the solvent has a low boiling point, for example below 150° C. Preferably, the solvent is volatile (can be easily volatised). Suitable solvents may be selected, for example, from alcohols, such as methanol, methyl cyanides, and from water.

According to an embodiment, in all preparation methods comprising a step of heating, drying, and/or evaporating, said step of heating, drying, and/or evaporating, respectively, is conducted so as to keep the temperature below the decomposing temperature of any of the component salts.

According to a preferred embodiment, the preparation method is at least partly conducted in a sealed container. According to an embodiment, it is conducted under a protective atmosphere.

The present invention provides an electrolyte comprising the composed ionic liquid of the present invention.

For example, the electrolyte is a binary, ternary, quaternary or quintary electrolyte ionic liquid electrolyte, meaning that it comprises 2, 3, 4, 5, or 5 component salts, preferably ionic liquids, resulting in an ionic liquid. Of course, the electrolyte may comprise more than 5 component salts.

The electrolyte of the invention has many applications. For example, it may be used in an optoelectronic and/or electrochemical device. The optoelectronic and/or electrochemical device may be, for example, a photoelectric conversion device, such as a photovoltaic cell, an electrochemical battery, for example a lithium ion battery, a double layer capacitor, a light emitting device, an electrochromic or photo-electrochromic device, an electrochemical sensor and/or biosensor. The electrochemical device may be an electrochemical display or an electrochemical capacitor, for example a super capacitor.

According to a preferred embodiment, the device of the present invention is a photovoltaic cell, for example a dye-sensitized photovoltaic (solar) cell (DSSC).

For example, a dye-sensitized photovoltaic cell comprises a photoelectrode, a counter electrode and, between the photoelectrode and the counterelectrode, an electrolyte or a charge transporting material, and wherein a sensitising dye is absorbed on the surface of the photoelectrode, on the side facing the counterelectrode.

The photoelectrode preferably comprises a nanocrystalline, porous layer of a semiconductor material, said porous layer being characterized by a roughness factor of larger than 20, preferably larger than 200 and even larger than 1000. Preferably, the photoelectrode is a photoanode. The photoelectrode and the counterelectrode are preferably provided on support substrates, such as transparent glass or plastic, at least one of which is transparent.

Electrode (photo- and counterelectrode) materials that are suitable for the photovoltaic cells of the present invention are disclosed in EP1507307, WO2006/010290, WO2007/093961, and in many more. Typical photoanode materials include semiconductor based on material selected from the group of Si, TiO2, SnO2, Fe2O3, WO3, ZnO, Nb2O5, CdS, ZnS, PbS, Bi2S3, CdSe, GaP, InP, GaAs, CdTe, CuInS2, and/or CuInSe2. In the above references, the manufacturing of such devices is also disclosed. In FIG. 1 of EP1507307, an embodiment of a possible structure of devices of the present invention is disclosed. On page 8, line 10 to page 9, line 51, general information and suitable materials of the preparation of devices encompassed by the present invention is disclosed. These documents are expressly and totally incorporated herein by reference. Of course, the present invention is not limited to devices as disclosed in these references.

Electrolytes of dye-sensitized solar cells further contain additives. Such additives may be added in the form of salts or as neutral compounds. In the solar cells of examples 7-9 below, some typical additives or added to the electrolyte.

The invention is now illustrated by way of the examples below, which are not intended do limit the scope of the present invention.

EXAMPLES

Example 1

Physical Properties of Ionic Liquids and in Particular of Composed Ionic Liquids of the Present Invention 1. Conductivities of Various Ionic Liquids The conductivities of different ionic liquids a-h are shown in FIG. 1. The conductivity is measured according to the standard method mentioned in the user manual of the used conductivity meter, which is the CDM210 type conductivity meter of French Radiometer-Analytical corp., and the used electrode is CDC-749 type.

The conductivity of d (melting point 90° C.-92° C.), e (melting point 78° C.-80° C.), and f (melting point 58° C.-60° C.) in the high temperature zone are all above those of a, b, and c. These ionic liquids are less preferred in dye-sensitized solar cells due to their high melting temperature.

A mixture of d and e in the molar ratio 1:1 results in the composed ionic liquid g, which has a similar conductivity as d and e, yet the melting point of g is reduced to 45-47° C.

The introduction of f into g to, while keeping the molar ratio of d, e, fat 1:1:1, results in the composed ionic liquid h, which is a ternary co-melt, room temperature molten ionic liquid with high conductivity, lower viscosity and which is not volatile.

2. Viscosity of a Composed Ionic Liquid at Increasing Temperature

The viscosities of the composed ionic liquid h at different temperatures are shown in Table 1 below. Viscosities are determined using a LVDV-II+ Pro viscosity meter of the Brookfield corp. using the standard method mentioned of the original manual of the viscosimeter.

TABLE 1

Viscosity of the composed ionic liquid DMII/EMII/AMII (1/1/1 molar ratio) at different temperatures

| Temperature (° C.) | | | | |
|---|---|---|---|---|
| | 25 | 30 | 35 | 40 | 45 |
| Viscosity (cP) | 491 | 344.8 | 255.5 | 179.3 | 133.1 |
| Temperature (° C.) | | | | |
| | 50 | 55 | 60 | 65 | 70 |
| Viscosity (cP) | 102.5 | 78.89 | 60.76 | 48.46 | 39.37 |

3. The Density of a Composed Ionic Liquid at Increasing Temperature

The densities of the composed ionic liquid h at different temperatures are shown in Table 2 below. Densities are determined using a DMA-35N type density meter of the Anton Paar corp using the standard method mentioned of the original manual of the density meter.

TABLE 2

Density of the composed ionic liquid DMII/EMII/AMII (1/1/1 molar ratio) at different temperatures

| Temperature (° C.) | 25 | 27.5 | 30 | 32.5 |
|---|---|---|---|---|
| Density (g/cm$^3$) | 1.6432 | 1.6406 | 1.6383 | 1.6364 |
| Temperature (° C.) | 35 | 37.5 | 40 | |
| Density (g/cm$^3$) | 1.6337 | 1.6313 | 1.6284 | |

Example 2

The Preparation of a Composed Ionic Liquid of the Invention by Heating 1,3-dimethylimidazolium iodide (DMII), 1-ethyl-3-methylimidazolium iodide (EMII) and 1-allyl-3-methylimidazolium iodide (AMII) are ionic liquids based on cationic imidazolium derivatives, which are all solids at room temperature.

Twenty (20) mmol of each of said ionic liquids are mixed in a single recipient, heated to 100-150° C. for 20-40 min, while stirred. In this way, the component salts are all melted and evenly dispersed, and a ternary ionic liquid, which is molten (liquid) at room temperature (RT, 25° C.), is obtained.

Example 3

Preparation of the Ionic Liquids of the Invention by Solvent Evaporation

Ten (10) mmol S-ethyl tetrahydrothiophenium iodide (melting point 80° C.) is dissolved in 20 ml alcohol, followed by the addition of 20 mmol S-ethyl-tetrahydrothiophenium dicyanamide. The mixture was stirred for couple hours and evaporated the ethanol solvent on a rotatory avaporator under vacuum to obtain a binary room temperature co-melted ionic liquid.

Example 4

Preparation of the Ionic Liquids of the Invention by Mechanical Grinding

Ten (10) mmol diethyl-methyl-sulfonium iodide (having a melting point of 35° C.), and 30 mmol diethylmethylsulfonium dicyanamide are put into the mortar and ground until all solid vanishes. In this way, a binary sulfonium salt type ionic liquid is obtained, which is liquid at room temperature (25° C.).

Example 5

Preparation of the Ionic Liquids of the Invention by Ultrasound Treatment 15 mmol 1,3-dimethylimidazolium iodide (solid at RT), 15 mmol 1-ethyl-3-methyllimidazolium iodide (solid at RT), and 20 mmol 1-ethyl-3-methylimidazolium thiocyanate (liquid at RT) are added and mixed. The obtained mixture is treated with ultrasound in the ultrasound device for 15-20 min, with the power of 200 W, resulting in the complete melting of all solids. In this way, a ternary imidazolium type co-melted ionic liquid, which is liquid at room temperature (25° C.), is obtained.

Example 6

Direct Synthetic Preparation of the Ionic Liquids of the Invention 60 mmol iodoethane was added to a mixture of 25 mmol N-methyl-imidazole and 25 mmol tetrahydrothiophene while stirring under the Ar atmosphere, reaction mixture was refluxed overnight with stirring. After this time the reaction mixture was cooled to room temperature and water was added. To this water dichloromethane was added and extracted three times to remove unreacted reactants. Then the water was evaporated on a rotatory evaporator to obtain a binary ionic liquid, which is liquid at room temperature.

Example 7

Preparation of a Dye-Sensitized Solar Cell Using the Ionic Liquid of the Invention A 7 μm-thick film of 20 nm sized $TiO_2$ particles was first printed on a fluorine-doped $SnO_2$ conducting glass electrode, and further coated by a 5 nm-thick second layer of 400-nm-sized light-scattering anastase particles. The sintered electrodes were immersed at room temperature for 12 h into a solution containing 300 μM Z907Na dye and 300 mM 3-phenylpropionic acid in acetonitrile and t-butyl alcohol (1:1, v/v). More details on the fabrication of device are provided in the publication of P. Wang, et al., Enhance the Performance of Dye-Sensitized Solar Cells by Co-grafting Amphiphilic Sensitizer and Hexadecylmalonic Acid on $TiO_2$ Nanocrystals, J. Phys. Chem. B., 107, 2003, 14336. The Z907 dye is disclosed in the publication of P. Wang et al., Charge separation and efficient Light Energy in Sensitized Solar Cells Based on Binary Ionic Liquids, J. Am. Chem. Soc. 127, 2005, 6850 and P. Wang et al., A Binary Ionic Liquid Electrolyte to Achieve ≥7% Power Conversion in Dye-Solar Cells. Chem. Mater. 16, 2004, 2694-2696.

As an electrolyte, a composition based on the following components was used:
  1,3-dimethylimidazolium iodide (DMII);
  1-ethyl-3-methylimidazolium iodide (EMII);
  1-allyl-3-methylimidazolium iodide (AMII);
  iodine ($I_2$);
  N-butylbenzoimidazole (NBB, additive);
  guanidinium thiocyanate (additive).

These components were added in a mol ratio of 8:8:8:1:2: 0.4. As a counter electrode, a glass electrode coated with nano-size platinum is used, as disclosed in the literature: preparation of P. Wang, et al., A Solvent-Free, $SeCN^-/(SeCN)_3^-$ Based Ionic liquid Electrolyte for High-Efficiency Dye-Sensitized Nanocrystalline Solar Cell, J. Am. Chem. Soc. 126, 2004, 7164). The device is assembled accordingly.

Device characteristics are measured when exposing the solar cell to the standard AM 1.5 G (sunlight) simulation at a light intensity of 100 mW/cm².

FIG. 2 shows the photocurrent density-voltage (J-V) characteristics of the devices. Short circuit current ($J_{sc}$) is 13.26 mA/cm², open circuit photo voltage ($V_{oc}$) is 712.62 mV, fill factor (ff) is 0.75, power conversion efficiency is 7.1%. This power conversion efficiency is much higher than that of 6% previously reported for a solvent free, PMII-based ionic liquid electrolyte. Remarkably, this ternary electrolyte composed of simple imidazolium iodides has shown a comparable efficiency to previously reported solvent-free electrolytes containing relatively expensive ionic liquids.

Example 8

Preparation of a Dye-Sensitized Solar Cell Using the Ionic Liquid of the Invention A further device was made according to the instructions given in Example 7, with the only difference being the electrolyte composition, which is given below:
  1,3-dimethylimidazolium iodide (DMII);
  1-ethyl-3-methylimidazolium iodide (EMII);
  1-ethyl-3-methylimidazolium thiocyanate (EMI NCS);
  iodine ($I_2$);
  N-butylbenzoimidazole (NBB, additive);
  guanidinium thiocyanate (additive).

These components were added in a mol ratio of 6:6:8:1:1: 0.2.

The device was tested under the same conditions as in Example 7.

FIG. 3 shows the device characteristics obtained with this solar cell: $J_{sc}$ is 13.22 mA/cm², open circuit photo voltage ($V_{oc}$) is 743.13 mV, fill factor (ff) is 0.774, power conversion efficiency is 7.6%.

Example 9

Fabrication of a Dye-Sensitized Solar Cell Using the Ionic Liquid of the Invention A further device was made according to the instructions given in Example 7, with the only difference being the electrolyte composition, which is given below:
  1,3-dimethylimidazolium iodide (DMII);
  1-ethyl-3-methylimidazolium iodide (EMII);
  1-ethyl-3-methylimidazolium tetracyanoborate (EMITCB);
  iodine ($I_2$);
  N-butylbenzoimidazole (NBB, additive);
  guanidinium thiocyanate (additive).

These components were added in a mol ratio of in the mol ratio 12:12:16:1.67:3.33:0.67.

The device was tested under the same conditions as in Example 7.

FIG. 4 shows the device characteristics obtained with this solar cell: $J_{sc}$ is 14.26 mA/cm², $V_{oc}$ is 741 mV, ff is 0.774, η is 8.2%. For the first time, such a high conversion efficiency under AM 1.5 G sunlight is obtained for a dye-sensitized solar cell with solvent free electrolyte. It is particularly remarkable that by simply replacing the PMII room temperature ionic liquid by the eutectic melt of DMII and EMII without changing the sensitizer or titania film has resulted in a 17% enhancement of photovoltaic performance.

FIG. 5 shows the photocurrent action spectrum of this device. The incident photon-to-current conversion efficiencies (IPCEs) exceed 60% in a broad spectral range from 460 to 650 nm, reaching its maximum of about 81% at 540 nm. From the overlap integral of this curve with the standard AM 1.5 solar emission spectrum, a short-circuit photocurrent density ($J_{SC}$) of 14.30 mA cm⁻² is calculated, which is in excellent agreement with the measured photocurrent. This confirms that there is no mismatch between the simulator used and AM 1.5 solar emission, showing that the conversion efficiency value of 8.2% truly refers to the standard reporting condition.

The invention claimed is:

1. An optoelectronic and/or electrochemical device being selected from a photoelectric conversion device, a photovoltaic cell and a dye-sensitized solar cell, said optoelectronic and/or electrochemical device having an electrolyte comprising a composed ionic liquid in liquid form at room temperature (25° C.) comprising three or more component salts being ionic liquids, wherein
at least one of said component salts has a melting point above room temperature,
at least three of said component salts comprise a cation independently selected from organic compounds comprising at least one charged atom selected from the group of $N^+$, $P^+$, $C^+$, $S^+$, and optionally comprising one or more heteroatoms, and
wherein two or more of said component salts of said composed ionic liquid comprise the same anion or the same cation.

2. The optoelectronic and/or electrochemical device according to claim 1, wherein the cation of said component salts are independently selected from:

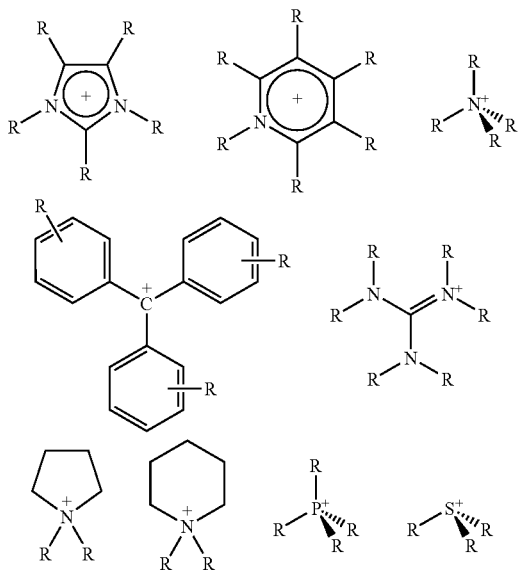

wherein
1) Any R is independently selected from:
H, provided that at least one R connected to a heteroatom is not H;
a straight alkyl or branched alkyl containing 1-20 carbon atoms; or,
straight alkenyl or branched alkenyl containing 2-20 carbon atoms and one or more double bonds;
a straight alkynyl or branched alkynyl containing 2-20 carbon atoms and one or more triple bonds;
a saturated, partially saturated or completely unsaturated cyclic alkyl containing 3-7 carbon atom; or,
halogen provided that the respective R is not connected to a heteroatom;
—$NO_2$, provided that the respective R is not connected to a heteroatom with positive charge and at least one R is not $NO_2$;
—CN, provided that the respective R is not connected to a heteroatom with positive charge and at least one R is not CN;
2) the moieties R of the cation of said components are same or different from each other,
two or more R may be coupled with each other via one or more single and/or double bonds;
one or more R are hydrogen-substituted partially or completely by halogen, or partially substituted by —CN or —$NO_2$, provided that at least one R is not halogenated;
one or two carbon atoms of R may be replaced by the heteroatoms, or selected from: —O—, —C(O)—, —C(O)O—, —S—, —S(O)—, —$SO_2$—, —$S(O)_2$O—, —N=, —P=, —NR'—, —PR'—, —P(O)(OR')—, —P(O)(OR')O—, —P(O)(NR'R')—, —PO(NR'R')O—, —P(O)(NR'R')NR'—, —S(O)NR'— and —$S(O)_2NR'$—;
Wherein R' is H, unfluorinated, partially fluorinated, or completely fluorinated alkyl containing 1-6 carbon atoms, or unfluorinated, partially fluorinated, or completely fluorinated phenyl.

3. The optoelectronic and/or electrochemical device according to claim 1, wherein said component salts comprise at least one anion independently selected from: $I^-$, $Br^-$, $Cl^-$, $[N(CN)_2]^-$, $[N(SO_2CF_3)_2]^-$, $[PF_6]^-$, $[BF_4]^-$, $[NO_3]^-$, $[C(CN)_3]^-$, $[B(CN)_4]^-$, $[CF_3COO]^-$, $[ClO_4]^-$, $[R^1SO_3]^-$, $[R^{F'}SO_3]^-$, $[(R^FSO_2)_2N]^-$, $[(FSO_2)_2N]^-$, $[(R^FSO_2)_3C]^-$, $[(FSO_2)_3C]^-$, $[R^1CH_2OSO_3]^-$, $[R^1C(O)O]^-$, $[R^{F'}C(O)O]^-$, $[CCl_3C(O)O]^-$, $[(CN)_2CR^1]^-$, $[(R^1O(O)C)_2CR^1]^-$, $[P(C_nF_{2n+1-m}H_m)_yF_{6-y}]^-$, $[P(C_6H_5)_yF_{6-y}]^-$, $[R^1_2P(O)O]^-$, $[R^1P(O)O_2]^{2-}$, $[(R^1O)_2P(O)O]^-$, $[(R^1O)P(O)O_2]^{2-}$, $[(R^1O)(R^1)P(O)O]^-$, $[R^F_2P(O)O]^-$, $[R^FP(O)O_2]^-$, $[BF_2R^F_{4-z}]^-$, $[BF_2(CN)_{4-z}]^-$, $[B(C_6F_5)_4]^-$, $[B(OR^1)_4]^-$, $[N(CF_3)_2]^-$, $[AlCl_4]^-$ or $[SiF_6]^{2-}$;
wherein:
n is an integer 1-20; m is 0, 1, 2, or 3; y is 0, 1, 2, 3 or 4; z is 0, 1, 2, or 3;
1) $R^F$ and $R^{F'}$ are independently selected from:
completely fluorinated alkyl containing 1-20 carbon atoms, but $R^{F'}$ does not include trifluoromethyl;
completely fluorinated alkenyl containing 2-20 carbon atoms and one or more double bonds; or,
completely fluorinated phenyl; or, saturated, partially unsaturated and or completely unsaturated cyclic alkyl group, said cycloakyl can be replaced by perfluoroalkyl;
2) In the case that there are more than one $R^F$ or $R^{F'}$ in an anion, they may be coupled with each other via single bond or double bonds, forming cyclic, bicylcic or polycyclic structures;
3) One carbon atom or two non-adjacent carbon atoms of the substituents $R^F$ or $R^{F'}$ which are not in the α-position to the hetero atom, may be replaced by the atoms and/or atom groups selected from —O—, —C(O)—, —S—, —S(O)—, —$SO_2$—, —N=, —N=N—, —NR'—, —PR'— and —P(O)R'—, or may have an end group R'—O—$SO_2$— or R'—O—C(O)—, R' represents an unfluorinated, partially fluorinated or completely fluorinated alkyl containing 1-6 carbon atoms, saturated or partially saturated cyclic alkyl group containing 3-7 carbon atoms, unsubstituted or substituted phenyl or an unsubstituted or substituted heterocyclic;
4) Wherein two or more anions comprising an $R^F$ or an $R^{F'}$ may be coupled to each other by a common $R^F$ or $R^{F'}$ thereby forming a single molecule comprising the negative charges of both anions as indicated above;
5) Wherein substituent $R^F$ or $R^{F'}$ may have one or two atoms or radicals or end groups selected from —$SO_2X'$, —O—, —$SO_2$—, and —NR'; wherein said atom, radical or end group is not in the α position, and wherein two of these are not connected with each other, wherein R' is unfluorinated, partially fluorinated or completely fluorinated alkyl containing 1-6 carbon atoms, a cycloalkyl containing 3-7 carbon atoms, which is or is not further substituted, phenyl, which is or is not further substituted, or a heterocycle which is or is not further substituted; and, wherein X' is F, Cl, or Br;

6) Wherein any substituent $R^1$ is independently selected from:
H, provided that at least one R connected to a heteroatom is not H;
straight-chain or branched alkyl containing 1-20 carbon atoms;
straight-chain or branched alkenyl containing 2-20 carbon atoms and one or more double bonds;
straight-chain or branched alkyne containing 2-20 carbon atoms and one or more triple bonds;
a saturated, partially saturated or completely unsaturated cyclic alkyl group containing 3-7 carbon atoms, which may be substituted by alkyl groups having 1-6 carbon atoms, wherein said substituent $R^1$ may be partially substituted by CN, SCN, SeCN, $NO_2$ or halogen, said halogen being F, Cl, Br, or I;

7) Wherein one carbon atom or two non-adjacent carbon atoms of the substituents $R^1$, which are not in the α-position to the heteroatom may be replaced by the atoms and/or atom groups selected from —O—, —C(O)—, —C(O)O—, —S—, —S(O)—, —$SO_2$—, —$SO_3$—, —N=, —N=N—, —NR'—, —PR'—, —P(O)R'—, —P(O)R'O—, —PR'$_2$=N—, —C(O)NH—, —C(O)NR'—, —$SO_2$NH— or —$SO_2$NR'—, wherein R' represents unfluorinated, partially fluorinated, or completely fluorinated alkyl containing 1-6 carbon atoms; or saturated or partially saturated cyclic alkyl group containing 3-7 carbon atoms; unsubstituted or substituted phenyl or an unsubstituted or substituted heterocycle.

4. The optoelectronic and/or electrochemical device according to claim 1, wherein at least one of said component salts comprises an anion selected from the group of I−, [B(CN)$_4$]−, and NCS−.

5. The optoelectronic and/or electrochemical device according to claim 1, wherein at least one of said component salts comprises a cation of formula (I) below:

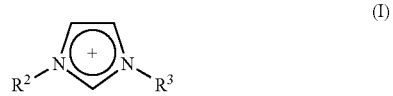

(I)

wherein $R^2$ and $R^3$ are independently of one another selected from C1-C10 alkyl, C1-C4 alkyl and C2-C10 alkenyl, wherein said alkyl and alkenyl may be linear, or, if it comprises at least three carbons, branched or cyclic, and may be partially or totally halogenated.

6. The optoelectronic and/or electrochemical device according to claim 5, wherein said alkyl is a C1-C4 alkyl and said alkenyl is a C2-C4 alkenyl.

7. The optoelectronic and/or electrochemical device according to claim 1, wherein at least two of said component salts comprise, each, a different cation independently selected from the group of substituted imidazolium compounds as defined in claim 2, and compounds of formula (I).

8. The optoelectronic and/or electrochemical device according to claim 1 wherein at least one or more cations of said component salts is selected from the group of 1-ethyl-3-methylimidazolium (EMI), 1,3-dimethylimidazolium (DMI), 1-propyl-3-methylimidazolium (PMI), and 1-allyl-3-methylimidazolium (AMI).

9. The optoelectronic and/or electrochemical device according to claim 5, wherein said alkyl is a C1-C3 alkyl and said alkenyl is a C2-C4 alkenyl.

10. The optoelectronic and/or electrochemical device according to claim 5, wherein said alkyl is a C1-C4 alkyl and said alkenyl is a C2-C3 alkenyl.

11. The optoelectronic and/or electrochemical device according to claim 5, wherein said alkyl is a C1-C3 alkyl and said alkenyl is a C2-C3 alkenyl.

* * * * *

UNITED STATES PATENT AND TRADEMARK OFFICE
CERTIFICATE OF CORRECTION

PATENT NO.        : 8,686,285 B2
APPLICATION NO.   : 12/735281
DATED             : April 1, 2014
INVENTOR(S)       : Jing Zhang et al.

Page 1 of 1

It is certified that error appears in the above-identified patent and that said Letters Patent is hereby corrected as shown below:

In the Specification:

- Column 9, line 50, please delete "ao" and insert --σo--

In the Claims:

- Column 16, line 24, please delete "[(FSO$_3$)$_3$C]$^-$" and insert --[(FSO$_2$)$_3$C]$^-$--

- Column 16, line 29, please delete "[BF$_2$(CN)$_{4-z}$]$^-$" and insert --[BF$_z$(CN)$_{4-z}$]$^-$--

Signed and Sealed this
Seventeenth Day of June, 2014

Michelle K. Lee
*Deputy Director of the United States Patent and Trademark Office*